United States Patent [19]

Matsuyama et al.

[11] Patent Number: 5,593,497
[45] Date of Patent: Jan. 14, 1997

[54] METHOD FOR FORMING A DEPOSITED FILM

[75] Inventors: Jinsho Matsuyama, Nagahama; Yutaka Hirai, Hikone; Masao Ueki, Urayasu; Akira Sakai, Nagahama, all of Japan

[73] Assignee: Canon Kabushiki Kaisha, Tokyo, Japan

[21] Appl. No.: 415,580

[22] Filed: Apr. 3, 1995

Related U.S. Application Data

[63] Continuation of Ser. No. 182,387, Jan. 18, 1994, abandoned, which is a continuation of Ser. No. 629,006, Dec. 18, 1990, abandoned, which is a continuation of Ser. No. 289,504, Dec. 23, 1988, abandoned, which is a continuation of Ser. No. 29,893, Mar. 25, 1987, abandoned.

[30] Foreign Application Priority Data

Mar. 31, 1986 [JP] Japan .................. 61-73093
Mar. 20, 1987 [JP] Japan .................. 62-67334

[51] Int. Cl.[6] .................................................. C30B 25/02
[52] U.S. Cl. .................. 117/90; 117/93; 117/94; 117/97; 117/106; 117/935; 437/246
[58] Field of Search .................. 427/255; 437/246; 117/935, 94, 97, 106, 90, 93

[56] References Cited

U.S. PATENT DOCUMENTS

| T954,009 | 1/1977 | Malin et al. | 427/93 |
|---|---|---|---|
| 3,620,833 | 11/1971 | Gleim et al. | 156/614 |
| 4,007,294 | 2/1977 | Woods et al. | 427/93 |
| 4,371,421 | 2/1983 | Fan et al. | 156/624 |
| 4,592,792 | 6/1986 | Corboy et al. | 156/613 |
| 4,637,127 | 1/1987 | Kurogi et al. | 156/613 |
| 4,735,822 | 4/1988 | Ohtoshi et al. | 427/255.1 |
| 4,800,173 | 1/1989 | Kanai et al. | 156/613 |
| 4,801,474 | 1/1989 | Saitoh et al. | 427/255 |
| 4,812,328 | 3/1989 | Saitoh et al. | 427/255 |
| 4,812,331 | 3/1989 | Hirooka et al. | 427/255 |
| 4,818,564 | 4/1989 | Ishihara et al. | 427/255 |

FOREIGN PATENT DOCUMENTS

| 53-73072 | 6/1978 | Japan | 427/93 |
|---|---|---|---|
| 55-71695 | 5/1980 | Japan | 156/614 |
| 61-190923 | 8/1986 | Japan | 427/93 |
| 61-190925 | 8/1986 | Japan | 427/93 |
| 61-190926 | 8/1986 | Japan | 427/93 |
| 2162206 | 7/1985 | United Kingdom | 156/610 |

OTHER PUBLICATIONS

Gandhi, "VLSI Fabrication Principles, Silicon and Gallium Arsenide" John Wiley and Sons, New York, 1983 pp. 388–392.
Filhy et al, "Single–Crystal Films of Silicon on Insulators", Brit. J. Applied Physics, 1967 vol. 18 pp. 1379,1357.

*Primary Examiner*—Robert Kunemund
*Attorney, Agent, or Firm*—Fitzpatrick, Cella, Harper & Scinto

[57] ABSTRACT

A method for forming a deposited film comprises the step of introducing a starting material (A) which is either one of a gaseous starting material for formation of a deposited film and a gaseous halogenic oxidizing agent having the property of oxidative action on said starting material into a film forming space in which a substrate having a material which becomes crystal neclei for a deposited film to be formed or a material capable of forming crystal nuclei selectively scatteringly on its surface is previously arranged to have said starting material (A) adsorbed onto the surface of said substrate to form an adsorbed layer (I) and the step of introducing a starting material (B) which is the other one into said film forming space, thereby causing surface reaction on said adsorption layer (I) to form a crystalline deposited film (I).

14 Claims, 4 Drawing Sheets

METHOD FOR FORMING A DEPOSITED FILM

This application is a continuation of application Ser. No. 08/182,387 filed Jan. 18, 1994, now abandoned, which is a continuation of application Ser. No. 07/629,006 filed Dec. 18, 1990, now abandoned which is continuation of application Ser. No. 07/289,504 filed Dec. 23, 1988, now abandoned, which is a continuation of application Ser. No. 07/029,893 filed Mar. 25, 1987, which is now abandoned.

BACKGROUND OF THE INVENTION

1. Field of the Invention

This invention relates to a method for formation of a deposited film useful for obtaining a functional film, particularly a semiconductive film which is useful for electronic devices such as semiconductor device, optical input sensor device for an optical image inputting apparatus, photosensitive device for electrophotography, etc.

2. Related Background Art

In the prior art, for formation of functional films, particularly crystalline semiconductor films, suitable film forming methods have been individually employed from the standpoint of desired physical characteristics, uses, etc.

For example, for formation of silicon deposited films such as of amorphous or polycrystalline, i.e. non-single crystalline, silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating amorphous silicon and "poly-Si (H,X)" when indicating polycrystalline silicon) (the so-called microcrystalline silicon is included within the category of A-Si (H,X) as a matter of course), there have been employed the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon deposited film according to the plasma CVD method which has been generalized in the prior art is considerably complicated as compared with the conventional CVD method, and its reaction mechanism is not well understood. Also, there exist a large number of parameters for formation of a deposited film such as substrate temperature, flow rate and flow rate ratio of gases to be introduced, pressure during formation, high frequency power, electrode structure, structure of a reaction vessel, speed of evacuation, plasma generating system, etc. By use of a combination of such a large number of parameters, plasma may sometimes become unstable, whereby marked deleterious influences were exerted frequently on a deposited film formed. Besides, parameters characteristic of film forming devices must be selected for each device and therefore under the present situation it has been difficult to generalize the production condition.

Also, in the case of the plasma CVD method, since plasma is directly generated by high frequency or microwave, etc., in a film forming space in which a substrate on which film is to be formed is placed, electrons or a number of ion species generated thereby may give damages to the film in the film forming process to cause lowering in film quality or non-uniformization of film quality. Moreover, the condition suitable for crystallization of a deposited film is restricted and therefore it has been deemed to be difficult to produce a polycrystalline deposited film with stable characteristics.

On the other hand, for formation of an epitaxial deposited film such as of silicon, germanium, group II–VI or Group III–V semiconductors, etc., there have been used the gas phase epitaxy and the liquid phase epitaxy as defined in a broad sense (generally speaking, the strict definition of epitaxy is to grow another single crystal on a single crystal, both having the same single crystal axes, but here epitaxy is interpreted in a broader sense and it is not limited to the growth onto a single crystal substrate).

The liquid phase epitaxy is a method for precipitating a semiconductor crystal on a substrate by dissolving a starting material for semiconductor at high temperature to a supersaturated state in a solvent metal which is molten to a liquid and cooling the solution. According to this method, since crystals are grown under a state closely approximating to thermal equilibrium among various epitaxy techniques, crystals with high perfectness can be obtained, but on the other hand, bulk productivity is poor and surface state is bad. For such reasons, in an optical device which requires an epitaxial layer which is thin and also uniform in thickness, problems are accompanied such as low yield in device production, or influences exerted on device characteristics, etc., and therefore this method is not frequently used.

On the other hand, the gas phase epitaxy has been attempted by physical methods such as the vacuum vapor deposition method, the sputtering method, etc., or chemical methods such as hydrogen reduction of a metal chloride or otherwise thermal pyrolysis of a metal organic compound or a metal hydride. Among them, the molecular beam epitaxy which is a kind of the vacuum vapor deposition method is a dry process under ultra-high vacuum, and therefore high purification and low temperature growth of crystals are possible, whereby there is the advantage that composition and concentration can be easily controlled to give a relatively flat deposited film. However, in addition to an enormous cost required for a film forming device, the surface defect density is great, and no effective method for controlling directionality of molecular beam has been developed, and also enlargement of area is difficult and bulk productivity is not so high. Due to such many problems, it has not been industrialized yet.

The hydrogen reduction method of a metal chloride or the thermal pyrolysis method of a metal organic compound or a metal hydride are generally called the halide CVD method, the hydride CVD method, MO-CVD method. For these methods, by the reason that a film forming device can be made with relative ease and also as the starting materials, i.e. metal chloride, metal hydrides and organic metals, those with high purities are now readily available, they have been studied widely at the present time and application for various devices has been investigated.

However, in these methods, it is required to heat a substrate to a high temperature at which reduction reaction or thermal pyrolysis reaction can occur and therefore the scope of substrate material to be selected is limited, and also contamination with impurities such as carbon or halogen, etc., is liable to occur if decomposition of starting material is insufficient, thus having the drawback that controllability of doping is poor. Also while, depending on the application use of a deposited film, it is desired to effect bulk production with reproducibility with full satisfaction in terms of enlargement of area, uniformization of film thickness as well as uniformness of film quality and yet at a high speed film formation, under the present situation no technique which enables bulk production with maintaining practical characteristics satisfying the above demands has been established yet.

SUMMARY OF THE INVENTION

A principal object of the present invention is to provide a method for forming a deposited film which is easy in control of film quality simultaneously with saving energy and can give a crystalline deposited film having desired characteristics uniformly over a large area and excellent in semiconductive characteristics.

Another object of the present invention is to provide a method for forming a deposited film which is excellent in productivity and bulk productivity and can form simply and efficiently a crystalline deposited film having high quality and excellent physical characteristics such as electrical, optical or semiconductive characteristics, etc.

The present invention has been accomplished as the result of intensive studies which have been made by the present inventors in order to achieve the objects of the present invention as mentioned above by solving the various problems as described above, and it is a method for forming a deposited film, comprising the step (A) of introducing a starting material (A) which is either one of a gaseous starting material for formation of a deposited film and a gaseous halogenic oxidizing agent having the property of oxidative action on said starting material into a film forming space in which a substrate having a material which becomes crystal neclei for formation of a deposited film to be formed thereon or a material capable of selectively forming crystal nuclei scatteringly on its surface is previously arranged to have said starting material adsorbed onto the surface of said substrate to form an adsorbed layer (I) and the step (B) of introducing the other starting material (B) into said film forming space, thereby causing the surface reaction on said adsorption layer (I) to form a crystalline deposited film (I).

The method for forming a deposited film of the present invention-having the above constitution has one specific feature in forming a deposited film by use of a gaseous halogenic oxidizing agent without utilizing plasma reaction while the plasma CVD method of the prior art forms plasma discharging by permitting discharging energy, etc., to act on starting gases for formation of a deposited film, and therefore, it has the advantage that no bad influence by etching or abnormal discharging, etc., during film formation will occur.

Also, the method for forming a deposited film of the present invention has another specific feature in forming a very thin deposited film on a substrate by making either one of a gaseous starting material and a gaseous halogenic oxidizing agent showing an oxidation action on said starting material adsorbed onto the substrate surface to form an adsorbed layer before introduction of the other, and by doing so there is the advantage that a deposited film with uniform film thickness and uniform film quality can be obtained.

Also, the method for forming a deposited film of the present invention utilizes the redox reaction of a gaseous starting material which becomes the constituent elements of the deposited film with a gaseous halogenic oxidizing agent and requires no high temperature for deposition, and therefore there is no disturbance of structure by heat, and no heating installation during production and no expense accompanied with running thereof are required, whereby a device can be made lower in cost. And, it becomes possible to select the substrate material from a wide scope of materials without depending on heat resistance.

Also, the method for forming a deposited film of the present invention forms a deposited film according to the reaction between a gaseous starting material and a gaseous halogenic oxidizing agent which progresses as concerned with the adsorbed molecules, and therefore enlargement of area is facilitated not depending on the shape and the size of the substrate, and at the same time starting materials employed may be very small in amounts, whereby the film forming space can be made smaller to improve dramatically the yield.

Also, the method for forming a deposited film of the present invention can determine the sizes of crystal grains by arranging nuclei for crystal growth as desired on a substrate, whereby a crystalline deposited film having the characteristics suited for the purpose can be deposited at any desired region.

Also, according to the method for forming a deposited film of the present invention having the constitution as described above, energy during formation of deposited film can be saved and at the same time control of film quality can be easily practiced, whereby it becomes possible to form a good crystalline deposited film having uniform film quality and characteristics over a large area. Further, it is possible to obtain efficiently a crystalline film which is excellent in productivity and bulk productivity, of high quality and also excellent in various characteristics such as electrical, optical, semiconductive characteristics, etc.

DESCRIPTION OF THE PREFERRED EMBODIMENT

Figure 1:
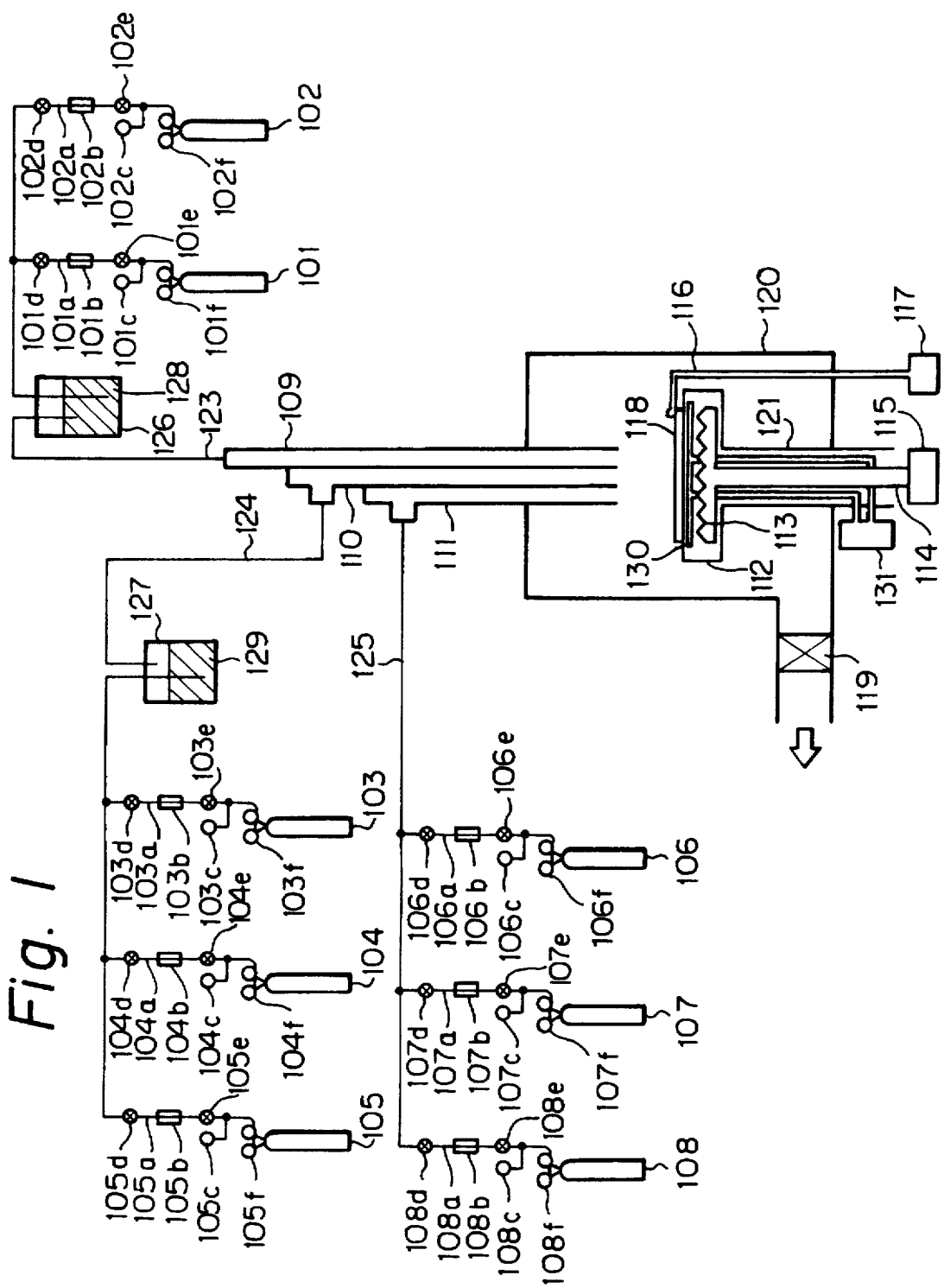
FIG. 1 is a schematic illustration of the film forming device used in Examples of the present invention.

In the method for forming a deposited film of the present invention, the gaseous starting material to be used for formation of a deposited film (hereinafter called "gaseous starting material (I)") is a material to be subjected to oxidation action through contact with the gaseous halogenic oxidizing agent (hereinafter called "halogenic oxidizing agent (II)"), and may be selected suitably as desired depending on the kind, characteristic, use, etc., of a deposited film to be desired. In the method of the present invention, the above gaseous starting material (I) and the halogenic oxidizing agent (II) have only to be gaseous when introduced, and may be gaseous, liquid or solid under an ordinary state. In the case when the gaseous starting material (I) or the halogenic oxidizing agent (II) is liquid or solid under an ordinary state, a carrier gas such as Ar, He, $N_2$, $H_2$, etc., is used to effect bubbling, optionally with heating, and thereby introduce the gaseous starting material (I) or the halogenic oxidizing agent (II) in a gaseous state into a film forming space to form an adsorbed layer on a substrate, and then the other material is introduced in a gaseous state.

During this operation, the introducing pressure of the above gaseous starting material (I) or the halogenic oxidizing agent (II) may be set by controlling the flow rate of the carrier gas or the vapor pressure of the gaseous starting material (I) or the halogenic oxidizing agent (II). When the gaseous starting material (I) or the halogenic oxidizing agent (II) is a gas under an ordinary state, it can be also introduced as diluted with a carrier gas such as Ar, He, $N_2$, $H_2$, etc., if necessary.

As the gaseous starting material (I) to be used in the method of the present invention, for obtaining a deposited film of e.g. silicon belonging to the group IV of the periodic table, there may be employed straight and branched chain silane compounds, cyclic silane compounds, etc., as effective ones.

Specifically as the gaseous starting material (I), examples of the straight chain silane compounds may include $Si_nH_{2n+2}$ (n=1, 2, 3, 4, 5, 6, 7 or 8), examples of the branched chain silane compounds $SiH_3SiH(SiH_3)SiH_2SiH_3$, and examples of cyclic silane compounds $Si_nH_{2n}$ (n=3, 4, 5 or 6) etc.

Of course, these silicon compounds may be used in the method of the present invention is made gaseous when introduced into a film forming space and at the same time has the property of exerting oxidation action effectively on the gaseous starting material (I) for formation of a deposited film only through contact therewith, and halogenic gases such as $F_2$, $Cl_2$, $Br_2$, $I_2$, ClF, etc., may be employed as effective ones.

Either one of these gaseous starting material (I) and halogenic oxidizing agent (II) is first introduced in a gaseous state at a desired flow rate and feeding pressure into a film forming space in which a substrate for formation of a deposited film is arranged to form an adsorbed layer on said substrate, and then the other is introduced after a desired time with a desired flow rate and feeding pressure, whereby they both are collided against each other on the surface of the above adsorbed layer to cause a surface chemical reaction, whereby the above halogenic oxidizing agent (II) exerts an oxidation reaction on the above gaseous starting material (I) to form a deposited film on the substrate having a material which becomes the crystal nuclei for a deposited film to be formed or a material capable of forming selectively crystal nuclei scatteringly on the surface. Such deposited film forming process of the present invention can proceed with a higher efficiency while saving energy, whereby a deposited film having desired good physical characteristics over the whole film surface can be formed at a lower substrate temperature than in the prior art.

In the method of the present invention, so that the deposited film forming process may proceed smoothly and a film having desired physical characteristics of high quality may be formed, as film forming factors, kinds and combination of the starting material for formation of a deposited film (I) and the halogenic oxidizing agent (II), pressure during reaction, flow rate, inner pressure of the film forming space, kind of the substrate, pressure during adsorption, flow pattern of the gases, adsorption temperature and film forming temperature (substrate temperature and atmosphere temperature) may be selected suitably as desired. These film forming factors are related organically, and they are not determined individually but determined respectively under mutual relationships. In the method of the present invention, the process of adsorption and reaction of the gaseous starting material (I) for formation of a deposited film and the gaseous halogenic oxidizing agent (II) to be introduced into the film forming space may be determined suitably as desired in the relationship with film forming factors concerned among the film forming factors as mentioned above.

The conditions of the step of forming an adsorbed layer on the substrate in the method for forming a deposited film of the present invention are suitably set.

In adsorption of gas molecules onto a solid surface, there exists intramolecular force, and the chemical adsorption with valence energy is greater in its intramolecular force than the physical adsorption with dispersion energy (corresponding to Van der Waals force).

Also, while physical adsorption is liable to become a multi-layer adsorption, a chemical adsorption is a monomolecular layer adsorption, and therefore preferably for controlling deposition of a homogeneous thin film, the adsorption should finally be in the form of chemical adsorption.

However, in the process of the present invention, the steps of adsorbed layer formation through deposited film formation, physical adsorption and chemical adsorption of gas molecules may be complicated when considered relative to each other, and the form of adsorption is not necessarily limited. On the other hand, the factors which determine the adsorption state may include the kind of adsorbed molecules, the kind of solid surface and the surface state, as well as temperature and pressure as controlling factors, and it is at least necessary to determine these controlling factors so that the reaction may be carried out to give a desired deposited film.

That is to say, if the pressure in the vacuum chamber retards adsorption and the reaction is too slow, desorption from the state of physical adsorption is liable to occur, while if the temperature is too high, dissociating adsorption from the state of chemical adsorption is liable to occur, and therefore the reaction process suitable for a desired deposited film must be selected.

In one cycle for formation of a deposited film of the present invention (the step (A) of adsorbed layer formation and the step (B) of deposited film formation through reaction between the adsorbed layer and the starting material), there are included the following steps prior to uniform formation of a deposited film on the substrate surface: The step of introducing the starting material A into the film forming space and permitting it in a suitable amount to be adsorbed on the substrate to form an adsorbed layer (the first step; step (A)) and the step of permitting the adsorbed layer of the starting material A to remain while discharging superfluous starting material A (the second step). In these steps, the pressures may be set suitably for the above reasons, and the pressure in the first step may be preferably higher for sufficient progress of adsorption, preferably $1\times10^{-7}$ to 10 Torr, more preferably $1\times10^{-4}$ to 1 Torr.

The pressure in the second step may be preferably lower for discharging superfluous starting material A, preferably $1\times10^{-10}$ to 1 Torr, more preferably $1\times10^{-9}$ to $1\times10^{-2}$ Torr.

Further, one cycle for formation of a deposited film of the present invention comprises subsequent to these steps the step of introducing the starting material B to cause the surface reaction with the adsorbed layer on the substrate to form a deposited film (the third step; step (B)), and the next step of discharging by-products formed other than the deposited film at this time (the fourth step), and the pressure during the reaction in the third step may be preferably higher in order to enhance the probability of the contact between the starting materials A and B, but the final value is determined suitably as desired in view of the reactivity.

The pressure in the third step may be preferably $1\times10^{-8}$ to 10 Torr, more preferably $1\times10^{-6}$ to 1 Torr.

The pressure in the fourth step may be preferably $1\times10^{-12}$ to 1 Torr.

In the present invention, the aforementioned steps (A) and (B) are conducted at least once, and depending on the case, steps (A) and (B) may be repeated in this order as required.

In that case, the time required for each step (A) or (B) may be constant or varied over the whole cycles.

In the method of the present invention, for forming selectively a desired crystalline deposited film, it is necessary to arrange previously a material which becomes crystal nuclei for a deposited film to be formed or a material capable of forming selectively crystal nuclei in the form corresponding to the purpose regularly or irregularly scatteringly on the substrate surface.

In the former case, by arrangement of single crystalline grains on the substrate, a crystal can be selectively grown with the single crystalline grains becoming crystal nuclei.

Also, by selecting suitably the film forming conditions and the-kind of crystalline material which become crystal nuclei, crystalline deposited films of different kinds can be selectively formed.

In the case of the latter, by utilizing the difference in nuclei formation density of the depositing material according to the kinds of the materials of the deposited surface, by arranging a different kind of material from the material in a desired pattern different from the substrate surface, a desired crystalline deposited film can be formed selectively.

As the substrate to be used in the former case, a substrate with small growth of silicon crystals having silicon single crystal grains arranged thereon may be employed. Further, in place of the silicon crystal as described above, crystals different in kind from silicon may be also used as the nuclei, but the materials of these crystals are required to satisfy the following conditions.

1. The lattice constant of the crystalline material on the substrate surface should be identical with or very approximate to the lattice constant of the deposited film.

2. The coefficients of thermal expansion of the crystalline material on the substrate surface and the deposited film should be identical with or very approximate to each other.

Hence, as the material which should constitute the surface of a suitable substrate for obtaining a deposited film of e.g. crystalline Si, there may be included $GaF_2$, $ZnS$, $Yb$, $Mn_3Ga$, $NaCoF_3$, $Ni_3Sn$, $Fe_3C$, $NiTe_x$ (x<0.7), $CoMnO_3$, $NiMnO_3$, $MaZn_3$, $CuCl$, $AlP$, $Si$, etc.

Further, even when the above two conditions are not fully satisfied, by selecting the deposition conditions more adequately, a crystalline deposited film can be also obtained, and the method for forming a deposited film of the present invention is not limited to the materials only as described above.

As the substrate to be used in the latter case, for example, those having $Si_3N_4$ scattered across the surface of a $SiO_2$ film or those having $SiO_2$ covering over $Si_3N_4$ film to partially have the subbing $Si_3N_4$ exposed.

These substrates utilize the property of silicon crystal nuclei which are formed with ease on $Si_3N_4$ and with difficulty on $SiO_2$, and in the method for forming a deposited film of the present invention, both amorphous and crystalline materials can be used, provided they have differences in difficultly and easiness in formation of nuclei.

The substrate temperature (Ts) during film formation may be set suitably depending on the kind of the deposited film to be formed and the kind of the substrate used.

The method of the present invention is described in more detail by use of Examples, but the present invention is not limited by these Examples.

FIG. 1 shows one example of a preferable device for embodying the method for formation of a deposited film of the present invention.

The device for forming a deposited film shown in FIG. 1 is divided broadly into three parts of the main device, the discharging system and the gas feeding system.

The main device is provided with a film forming space.

101 to 108 are respectively bombs filled with the gases to be used during film formation, 101a–108a are respectively gas feeding pipes, 101b–108b are respectively mass flow controllers for controlling the flow rates of the gases from the respective bombs, 101c–108c are respectively gas pressure gauges, 101d–108d and 101e–108e are respectively valves, and 101f–108f are respectively pressure gauges indicating the pressures in the corresponding gas bombs.

120 is a vacuum chamber, having a structure such that a pipeline for introduction of gas is provided at the upper portion and a reaction space is formed downstream of the pipeline, and also having a structure such that a film forming space provided with a substrate holder 112 may be formed so that a substrate 118 may be placed in opposition to the gas introducing inlet of said pipeline. The pipeline for introduction of gas has a three-arrangement structure, having from the innerside a first gas introducing pipe 109 for introducing gases for the gas bombs 101, 102, a second gas introducing pipe 110 for introducing the gases from the gas bombs 103–105, and a third gas introducing pipe 111 for introducing the gases from the gas bombs 106–108.

Feeding of the gases from the bombs to the respective introducing pipes is done through the gas feeding pipelines 123–125, respectively.

The respective gas introducing pipes, the respective gas feeding pipelines and the vacuum chamber 120 are evacuated to vacuum by a vacuum evacuating device not shown through the main vacuum valve 119.

The substrate 118 can be set freely at any desired position relative to the respective gas introducing pipes by moving the substrate holder 112 vertically and in the directions of X and Y.

In the case of the method of the present invention, the distance between the substrate and the gas introducing inlet of the gas introducing pipe may be determined appropriately in view of the kinds of the deposited film to be formed, its desired characteristics, gas flow rates, the inner pressure of the vacuum chamber, etc., but it should preferably several mm to 20 cm, more preferably about 5 mm to 15 cm.

130 is a cooling pipe for making the gas molecules of the starting material A easily adsorbable onto the substrate 118, and it is connected to the flow rate controller 131. Cooling can be also used during film formation or after film formation other than in the first and the second steps in which adsorption is effected.

113 is a heater for heating the substrate, which heats the substrate 118 to an appropriate temperature during film formation, preheats the substrate 118 before film formation, and further, after film formation, heats the film for annealing.

To the heater for heating the substrate 113 is fed power from the power source 115 through the wire 114.

116 is a thermocouple for measuring the temperature of the substrate (Ts) and is connected electrically to the temperature display device 117.

126 and 127 are bubblers for liquid starting materials, and used with filling of liquid starting materials for formation of a deposited film 128 and 129. When the starting materials for formation of a deposited film are gases under an ordinary state, it is not necessary to use bubblers for liquid starting materials.

EXAMPLE 1

By means of the film forming device shown in FIG. 1, a deposited film according to the method of the present invention was prepared as described below.

SiH$_4$ gas filled in the bomb 101 was fed at a flow rate of 40 sccm through the gas introducing pipe 109, F$_2$ gas filled in the bomb 106 at a flow rate of 60 sccm and the He gas filled in the bomb 107 at a flow rate 120 sccm through the gas introducing pipe 111 into the vacuum chamber 120. In this Example, the bubblers 126 and 127 for liquid starting materials were not used.

The substrate 118 was prepared according to the steps shown in FIG. 2.

Figure 2A:
FIGS. 2a to 2f show embodiments of the film forming steps according to the present invention.
Figure 2B:
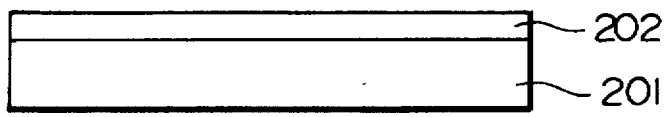

First, a polycrystalline silicon substrate 201 as shown in FIG. 2(A) was washed, and subsequently silicon oxide thin film 202 was deposited on the whole surface of the substrate 1 according to the sputtering method (in this step other various thin film depositing methods such as vacuum vapor deposition, plasma discharging, MBE, CVD, etc., may be employed) (FIG. 2(B)).

Figure 2C:
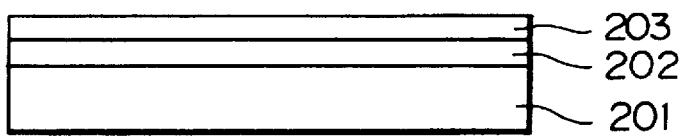
Figure 2D:
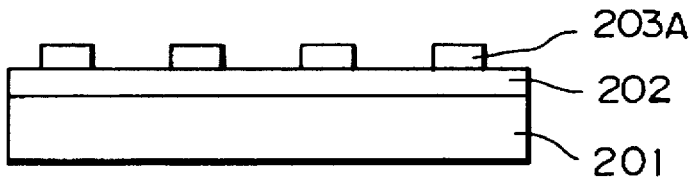

Subsequently, an electron beam resist layer 203 was formed on the thin film 202 (FIG. 2(C)), and the electron beam resist layer 203 exposed to light by use of a photomask with a desired pattern and the electron beam resist layer 203 was partially removed by development (FIG. 2(D)).

Figure 2E:
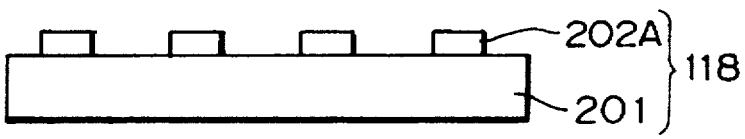

With the use of the remaining electron beam resist 203A as the mask, the silicon oxide thin film 202 was subjected to etching to form a thin film 202A with a desired pattern(FIG. 2(E)).

According to the steps as described above, a substrate 118 with the crystal faces where a polycrystalline silicon exists were exposed at constant intervals from the silicon oxide film was obtained. The domains of the silicon crystal exposed on the substrate surface were 500 Å in width, with intervals of 300 μm therebetween.

Next, the vacuum chamber 120 was evacuated under sufficient baking by means of an evacuating device not shown to 5×10$^{-9}$ Torr. SiH$_4$ gas filled in the bomb 101 was permitted to flow at a flow rate of 4 sccm through the gas introducing pipe 109 into the vacuum chamber 120 for 0.3 sec under the state maintained at an evacuating speed of 0.1 m Torr/cm by controlling the evacuating valve 119. Subsequently, the valve 101d was closed to stop feeding of SiH$_4$ gas, and the state controlled to a vacuum degree of 0.01 Torr by opening the evacuating valve 119 was maintained for 2 sec.

F$_2$ gas (diluted to 10% with He) filled in the bomb 107 was introduced at 4 sccm through the gas introducing pipe 111 into the vacuum chamber 120. The evacuation rate at this time was controlled to 0.8 m Torr/sec by controlling the evacuating valve 119, and after this state was maintained for 5 sec, the valve 107a was closed to stop feeding of F$_2$ gas, and the state controlled to a vacuum degree of 0.004 Torr by opening the evacuation valve 119 was maintained for 3 sec.

By repeating the operation as described above for 4200 times, a crystalline silicon deposited film 204 with a thickness of about 4600 Å was obtained.

Figure 2F:
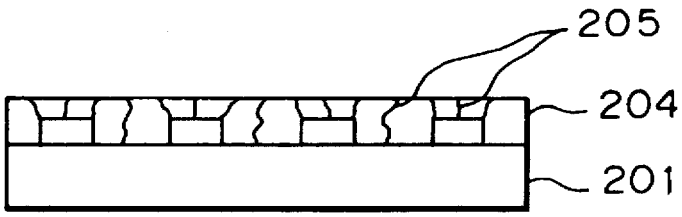

FIG. 2(F) shows schematically the cross-section of the crystalline silicon deposited film 204 obtained on the substrate 118. 205 denotes grain boundaries in FIG. 2(F).

Further, by the use of the respective samples obtained, crystallinity of the deposited films was evaluated by the X-ray diffraction method and the electron beam diffraction method, whereby they were confirmed to be polycrystalline films. Further, the grain size of the polycrystalline silicon was found to be about 250±20 μm. Variance in crystal grain sizes was uniform over the whole surface of the substrate.

When the surface state of the samples was observed by a scanning type electron microscope, the smoothness was good without wavy pattern, etc., and the film thickness irregularity t was ±4% or less. Also the mobility and conductivity of the crystalline Si deposited film of the obtained samples was measured by the Van der Pauw method to be 250 (cm/V sec), 5×10$^{-5}$(S cm$^{-1}$), respectively.

EXAMPLE 2

The substrate 118 was prepared according to the steps shown in FIG. 3.

Figure 3A:
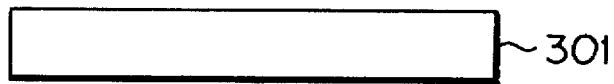
FIGS. 3a to 3e show another embodiments of the film forming steps according to the present invention.
Figure 3B:
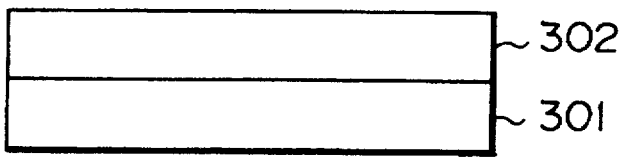

First, a glass base plate 301 of a material having substantially uniform composition as shown in FIG. 3(A) was washed and then an amorphous SiN (A-SiN) thin film 302 was formed with a thickness of about 2 μm on the whole surface of the base plate 301 (FIG. 3(B)) by means of thermal CVD.

Figure 3C:
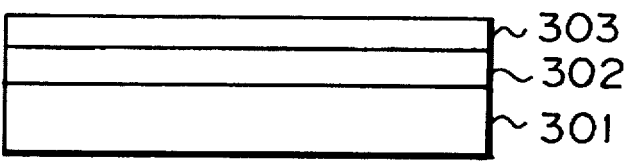
Figure 3D:
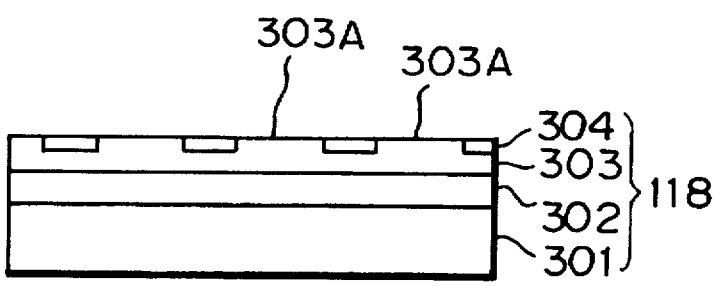
Figure 3E:
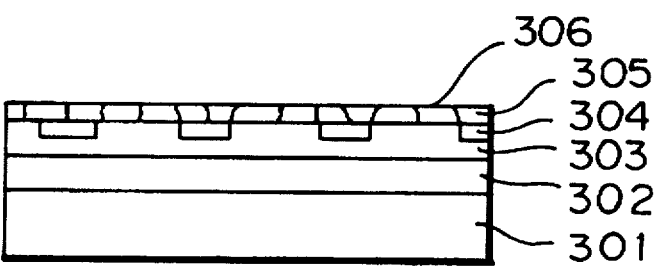

Subsequently, surface annealing of the above A-SiN thin film 302 was effected in N$_2$ atmosphere by means of a laser annealing device on the A-SiN thin film 302 to form crystalline Si$_3$N$_4$ (C-Si$_3$N$_4$) 303 in the surface layer (up to 1 μm deep of the A-SiN thin film 302 to 1 μm (FIG. 3(C)).

As the laser used at this time, Ar-CW laser of 4880 Å, a scanning speed of 2.5 cm/sec and an energy of 10 W was irradiated. Subsequently, the surface of the C-Si$_3$N$_4$ layer 303 was scanned by means of the above laser annealing device in O$_2$ atmosphere to form selectively the SiO$_2$ layer 304 (FIG. 3(D)).

According to the steps as described above, a substrate 118 having C-Si$_3$N$_4$ layer 303A exposed at constant intervals with other portions being covered with SiO$_2$ layer 304 was formed. The domains of C-Si$_3$N$_4$layer 303A exposed on the substrate surface were about 300 μm in width with intervals of 200 μm therebetween.

Further, by use of this substrate 118, crystalline silicon was deposited by means of the device shown in FIG. 1 similarly as described in Example 1.

First, the vacuum chamber 120 was evacuated under sufficient baking by means of an evacuation device not shown to 5×10$^{-9}$ Torr. SiH$_4$ gas filled in the bomb 101 was permitted to flow for 0.3 sec at a flow rate of 5 sccm into the vacuum chamber 120 through the gas introducing pipe 109 under the state maintained at an evacuation speed of 0.1 m Torr/sec by controlling the evacuating valve 119. Subsequently, the valve 101d was closed to stop feeding of the SiH$_4$ gas, and the evacuation valve 119 was opened and the state controlled to a vacuum degree of 0.1 Torr was maintained for 2 sec.

F$_2$ gas (diluted to 10% with He) filled in the bomb 107 was introduced at 6 sccm through the gas introducing pipe 111 into the vacuum chamber 120. The evacuation rate at this time was made 0.8 m Torr/sec by controlling the evacuation valve 119, and after this state was maintained for 5 sec, the valve 107a was closed to stop feeding of the F$_2$ gas, and the state controlled to vacuum of 0.01 Torr was maintained for 4 sec by opening the evacuation valve 119.

By repeating this operation for 4500 times, a crystalline silicon deposited film with a thickness of about 2.3 μm was obtained.

FIG. 3(F) shows schematically the cross-section of the crystalline silicon deposited film 305 obtained on the substrate 118. 306 denotes grain boundaries in FIG. 3(F).

Further, by use of the respective samples obtained, crystallinity of the deposited films was evaluated by the X-ray diffraction method and the electron beam diffraction method, whereby they were confirmed to be polycrystalline silicon films. Further, the grain size of the polycrystalline silicon determined by the Scherrar method was found to be about 120±25 μm. Variance in crystal grain sizes was uniform over the whole surface of the substrate.

When the surface state of the sample was observed by a scanning type electron microscope, the smoothness was good without wavy pattern, etc., and the film thickness irregularity was ±4% or less. Also, the mobility and conductivity of the crystalline Si deposited film of the obtained samples was measured by the Van der Pauw method to be 120 (cm/V sec), $9 \times 10^{-6}$ (S cm$^{-1}$), respectively.

EXAMPLE 3

By means of the film forming device shown in FIG. 1, a deposited film according to the method of the present invention was prepared as described below.

$SiH_4$ gas filled in the bomb 101 was fed at a flow rate of 40 sccm through the gas introducing pipe 109, $F_2$ gas filled in the bomb 106 at a flow rate of 60 sccm and the He gas filled in the bomb 107 at a flow rate 120 sccm through the gas introducing pipe 111 into the vacuum chamber 120. In this Example, the bubblers 126 and 127 for liquid starting materials were not used.

The substrate 118 was prepared according to the steps shown in FIG. 4.

Figure 4A:
FIGS. 4a to 4g show further embodiments of the film forming steps according to the present invention.
Figure 4B:
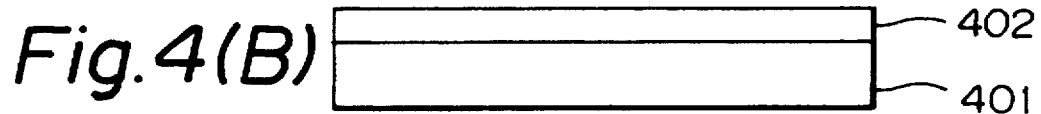

First, a polycrystalline silicon substrate 401 as shown in FIG. 4(A) was washed, and subsequently amorphous $SiO_2$ thin film 402 was deposited on the whole surface of the substrate 401 according to the sputtering method (in this step other various thin film depositing methods such as vacuum vapor deposition, plasma discharging, MBE, CVD, etc., may be employed) FIG. 4(B)). Then, amorphous $Si_3N_4$ thin film 403 was deposited on said $SiO_2$ thin film 402 [FIG. 4(C)].

Subsequently, an electron beam resist layer 404 was formed on the thin film 403 [FIG. 4(D)], and the electron beam resist layer 404 exposed to light by use of a photomask with a desired pattern and the electron beam resist layer 404 was partially removed by development [FIG. 4(E)].

Figure 4C:
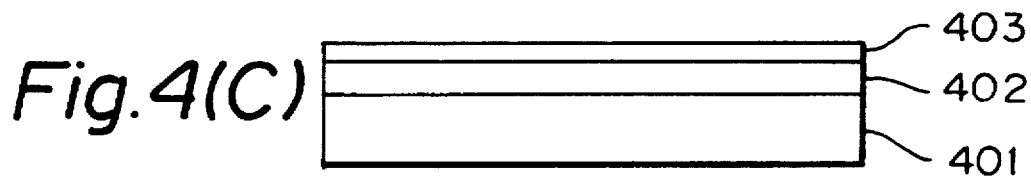
Figure 4D:
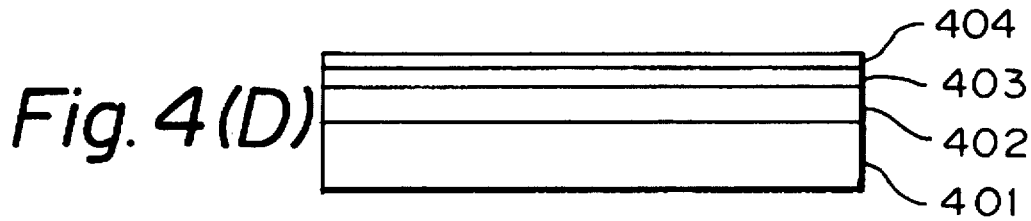
Figure 4E:
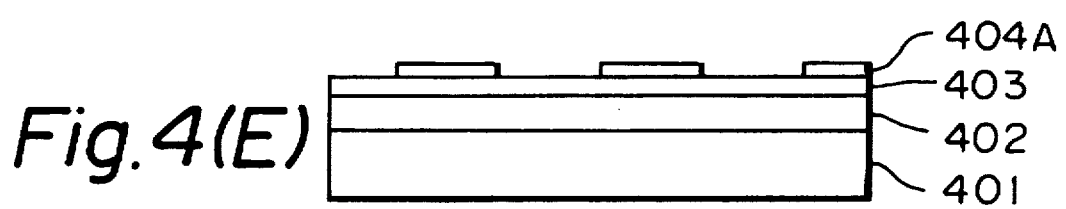
Figure 4F:
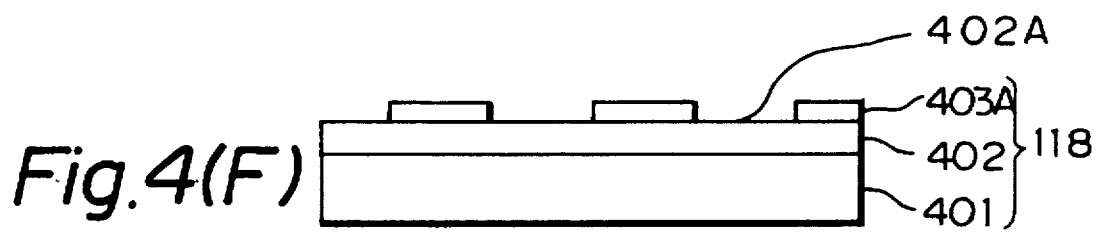

With the use of the remaining electron beam resist layer 404A as the mask, the $Si_3N_4$ thin film 403 was subjected to etching to form $Si_3N_4$ thin film 403A with a desired pattern [FIG. 4(F)].

According to the steps as described above, a substrate 118 where the surface of the $SiO_2$ layer 402 was exposed at constant intervals from the $Si_3N_4$ thin film 402 was obtained. The above $Si_3N_4$ thin film portions were arranged on the $SiO_2$ thin film 402 at a width of 200 μm and an interval of 200 μm.

Next, the vacuum chamber 120 was evacuated under sufficient baking by means of an evacuating device not shown to $5 \times 10^{-9}$ Torr. $SiH_4$ gas filled in the bomb 101 was permitted to flow at a flow rate of 4 sccm through the gas introducing pipe 109 into the vaccum chamber 120 for 0.3 sec under the state maintained at an evacuating speed of 0.1 mTorr/cm by controlling the evacuating valve 119. Subsequently, the valve 101d was closed to stop feeding of $SiH_4$ gas, and the state controlled to a vacuum degree of 0.01 Torr by opening the evacuating valve 119 was maintained for 2 sec.

$F_2$ gas (diluted to 10% with He) filled in the bomb 107 was introduced at 4 sccm through the gas introducing pipe 111 into the vaccum chamber 120. The evacuation rate at this time was controlled to 0.8 mTorr/sec by controlling the evacuating valve 119, and after this state was maintained for 5 sec, the valve 107a was closed to stop feeding of $F_2$ gas, and the state controlled to a vacuum degree of 0.004 Torr by opening the evacuation valve 119 was maintained for 3 sec.

By repeating the operation as described above for 10000 times, a crystalline silicon deposited film 405 with a thickness of about 3.0 μm was obtained.

Figure 4G:
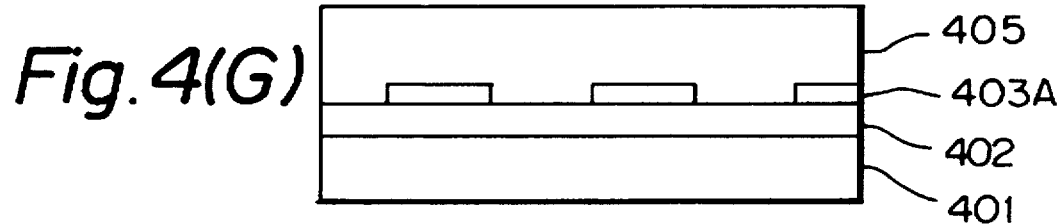

FIG. 4(G) shows schematically the cross-section of the crystalline silicon deposited film 405 obtained on the substrate 118.

Next, by the use of the respective samples obtained, crystallinity of the silicon deposited films was evaluated by the X-ray diffraction method and the electron beam diffraction method, whereby they were confirmed to be polycrystalline silicon films. Further, the grain size of the polycrystalline silicon determined by the Scherrar method was found to be about 40±0.5 μm. Variance in crystal grain sizes was uniform over the whole surface of the substrate.

When the surface state of the samples was observed by a scanning type electron microscope, the smoothness was good without wavy pattern, etc., and the film thickness irregularity t was ±4% or less. Also, the mobility and conductivity of the crystalline Si deposited film of the obtained samples was measured by the Van der Pauw method to be 300 (cm/V sec), $9 \pm 10^{-6}$ (S cm$^{-1}$), respectively.

EXAMPLE 4

The substrate 118 was prepared according to the steps shown in FIG. 4.

First, a glass base plate 401 of a material having substantially uniform composition as shown in FIG. 4(A) was washed and then an amorphous SiN:H thin film 402 was formed using $SiH_4$ gas and $NH_3$ gas with a thickness of about 2 μm on the whole surface of the base plate 401 [FIG. 3(B)] by means of plasma CVD.

Subsequently, an amorphous $SiO_2$ thin film 404 was formed to 500 Å thick on the above SiN:H thin film 402 by means of the sputtering method [FIG. 4(C)].

Then, an electron beam resist layer 404 was applied onto the $SiO_2$ thin film 403 [FIG. 4(D)], and the electron beam resist layer 404 was exposed with the use of a photo-mask having a desired pattern followed by partial removal of the electron beam resist layer 404 by development [FIG. 4(E)]. The $SiO_2$ layer 403 was then subjected to etching to form an $SiO_2$ layer 403A having a desired pattern with utilizing the remaining electorn beam resist layer 404A as a mask.

According to the steps as described above, a substrate 118 having domains 402A where the $Si_3N_4$ layer 402 was exposed at constant intervals with other portions being covered with $SiO_2$ layer 403A was formed. The domains of $Si_3N_4$ layer 402A exposed on the substrate surface were about 300 μm in width with intervals of 280 μm therebetween.

Further, by use of this substrate 118, crystalline silicon was deposited by means of the device shown in FIG. 1 similarly as described in Example 3.

First, the vacuum chamber 120 was evacuated under sufficient baking by means of an evacuation device not shown to $5 \times 10^{-9}$ Torr. $SiH_4$ gas filled in the bomb 101 was permitted to flow for 0.3 sec at a flow rate of 5 sccm into the vacuum chamber 120 through the gas introducing pipe 109 under the state maintained at an evacuation speed of 0.1 mTorr/sec by controlling the evacuating valve 119. Subsequently, the valve 101d was closed to stop feeding of the SiH$_4$ gas, and the evacuation valve 119 was opened and the state controlled to a vacuum degree of 0.1 Torr was maintained for 2 sec.

F$_2$ gas (diluted to 10% with He) filled in the bomb 107 was introduced at 6 sccm through the gas introducing pipe 111 into the vacuum chamber 120. The evacuation rate at this time was made 0.8 mTorr/sec by controlling the evacuation valve 119, and after this state was maintained for 5 sec, the valve 107a was closed to stop feeding of the F$_2$ gas, and the state controlled to vacuum of 0.01 Torr was maintained for 4 sec by opening the evacuation valve 119.

By repeating this operation for 7000 times, a crystalline silicon deposited film with a thickness of about 2.8 μm was obtained.

FIG. 4(G) shows schematically the cross-section of the crystalline silicon deposited film 405 obtained on the substrate 118.

Further, by use of the respective samples obtained, crystallinity of the deposited films was evaluated by the X-ray diffraction method and the electron beam diffraction method, whereby they were confirmed to be polycrystalline silicon films. Further, the grain size of the polycrystalline silicon was found to be about 90±7 μm. Variance in crystal grain sizes was uniform over the whole surface of the substrate.

When the surface state of the sample was observed by a scanning type electron microscope, the smoothness was good without wavy pattern, etc., and the film thickness irregularity was ±4% or less. Also, the mobility and conductivity of the crystalline Si deposited film of the obtained samples was measured by the Van der Pauw method to be 120 (cm/V sec), 4×10$^{-6}$ (S cm$_{-1}$), respectively.

The method for forming a deposited film of the present invention can form a deposited film only by contacting a gaseous starting material with a gaseous halogenic oxidizing agent, and has the advantage of requiring particularly no reaction exciting energy from the outside. Accordingly, it becomes possible to lower the substrate temperature. Also, since a material which becomes the crystal nucleus for the deposited film or capable of forming selectively the crystal nucleus can be arranged at a desired position on the substrate surface, any desired crystalline deposited film can be formed. Further, simultaneously with saving of energy, it is possible to obtain a crystalline deposited film having uniform film quality and characteristics over a large area with easy control of the film quality. Further, a crystalline film excellent in productivity, bulk productivity and having high quality with excellent electrical, optical semiconductive and other physical properties can be obtained with ease.

What we claim is:

1. A method for forming a crystalline deposited film employing starting materials (A) and (B), comprising:

(a) introducing one of the starting materials into a film forming space having a substrate therein to be adsorbed onto the substrate as an adsorption layer; said material being capable of selectively forming a crystal nucleus for a deposited film upon said substrate; said substrate having a first surface and a second surface on said first surface, said first surface being an amorphous material adapted to readily form crystal nuclei and having exposed areas at specific intervals through said second surface, said second surface having a reduced capacity to form crystal nuclei compared to said first surface, wherein the pressure of said film forming space is maintained within a range of 1×10$^{-7}$ Torr to 10 Torr;

(b) evacuating said film forming space to adjust the pressure therein to a pressure within a range of 1×10$^{-10}$ torr to 1 Torr; and (c) introducing the other starting material into said film forming space after said adsorption layer is formed, to thereby cause a surface reaction on said adsorption layer to form said crystal nucleus on said first surface and to grow a crystalline deposited film from said crystal nucleus without adding heat to promote the reaction; said starting material (A) being a gaseous material for forming a deposited film; and said starting material (B) being a gaseous halogenic oxidizing agent capable of having an oxidative action on said starting material (A).

2. A method for forming a deposited film according to claim 1, wherein said starting material (B) is introduced into the film forming space to form said adsorption layer.

3. A method for forming a deposited film according to claim 1, wherein said starting material (A) is introduced into the film forming space to form said adsorption layer.

4. A method for forming a deposited film according to claim 1, further comprising:

feeding one of said starting materials (A) or (B) and allowing said starting material to adsorb onto the surface of said deposited film to thereby form a second adsorption layer;

feeding the other starting material into said film forming space to thereby cause a surface reaction on said second adsorption layer to form a second deposited film.

5. A method for forming a deposited film according to claim 1, wherein said gaseous starting material is a chain silane compound.

6. A method for forming a deposited film according to claim 5, wherein said chain silane compound is a straight chain silane compound.

7. A method for forming a deposited film according to claim 6, wherein said straight chain silane compound is represented by the formula Si$_n$H$_{2n+2}$ (n is an integer of 1 to 8).

8. A method for forming a deposited film according to claim 5, wherein said chain silane compound is a branched chain silane compound.

9. A method for forming a deposited film according to claim 1, wherein said gaseous starting material is a silane compound having a cyclic structure of silicon.

10. A method for forming a deposited film according to claim 1, wherein said gaseous halogenic oxidizing agent contains a halogen gas.

11. A method for forming a deposited film according to claim 1, wherein said gaseous halogenic oxidizing agent contains fluorine gas.

12. A method for forming a deposited film according to claim 1, wherein said gaseous halogenic oxidizing agent contains chlorine gas.

13. A method for forming a deposited film according to claim 1, wherein said gaseous halogenic oxidizing agent is a gas containing fluorine atoms as a constituent.

14. The method of claim 1 including employing a first surface of amorphous silicon nitride and a second surface of silicon oxide.

\* \* \* \* \*

UNITED STATES PATENT AND TRADEMARK OFFICE
CERTIFICATE OF CORRECTION

PATENT NO. : 5,593,497

DATED : January 14, 1997

INVENTOR(S) : Jinsho Matsuyama et al.

Page 1 of 4

It is certified that error appears in the above-identified patent and that said Letters Patent is hereby corrected as shown below:

At [57] in the Abstract
  line 9, "neclei" should read --nuclei--

Column 3
  line 11, "and" should read --and is--

Column 3
  line 30, "neclei" should read --nuclei--

Column 3
  line 39, "invention-having" should read --invention having--

Column 3
  line 42, "forms" should read --performs--

Column 4
  line 33, "2a to 2f show embodiments" should read --2(A) to 2(F) show an embodiment--

Column 4
  line 35, "3a to 3e show another embodiments" should read --3(A) to 3(E) show another embodiment--

Column 4
  line 37, "4a to 4g show further embodiments" should read --4(A) to 4(G) show a further embodiment--

UNITED STATES PATENT AND TRADEMARK OFFICE
CERTIFICATE OF CORRECTION

PATENT NO. : 5,593,497

DATED : January 14, 1997

INVENTOR(S) : Jinsho Matsuyama et al.

It is certified that error appears in the above-identified patent and that said Letters Patent is hereby corrected as shown below:

Column 4
  line 49, "as desired" should be deleted

Column 5
  line 16, "compound may be" should read --compounds, when--

Column 5
  line 17, "is" should read --are--

Column 5
  line 17, "invention" should read --invention,--

Column 5
  line 19, "has" should read --have--

Column 7
  line 2, "cycles." should read --cycle.--

Column 7
  line 14, "the-kind" should read --the kind--, and "become" should read --becomes--

Column 7
  line 19, "kinds of materials" should read --kind of material--

Column 7
  line 48, "to be used" should be deleted

UNITED STATES PATENT AND TRADEMARK OFFICE
CERTIFICATE OF CORRECTION

PATENT NO. : 5,593,497

DATED : January 14, 1997

INVENTOR(S) : Jinsho Matsuyama et al.

It is certified that error appears in the above-identified patent and that said Letters Patent is hereby corrected as shown below:

Column 7
  line 50 "$Si_3N_4film$" should read --$Si_3N_4$ film--

Column 7
  line 51, "exposed." should read --exposed may be used.--

Column 8
  line 44, "should" should read --should be--

Column 11
  line 37, "FIG." should read --(FIG.--

Column 12
  Line 27, "$9\pm10^{-6}$" should read --$9\times10^{-6}$--

Column 12
  line 50, "electorn" should read --electron--.

UNITED STATES PATENT AND TRADEMARK OFFICE
CERTIFICATE OF CORRECTION

PATENT NO. : 5,593,497

DATED      : January 14, 1997

INVENTOR(S) : Jinsho Matsuyama et al.

It is certified that error appears in the above-identified patent and that said Letters Patent is hereby corrected as shown below:

```
Column 14
  line 26, "or (B)" should read --or (B) into the film
forming space--

Column 14
  line 29, "layer;" should read --layer; and--
```

Signed and Sealed this

Twelfth Day of August, 1997

Attest:

Attesting Officer

BRUCE LEHMAN

Commissioner of Patents and Trademarks